United States Patent
Su

(10) Patent No.: US 9,525,132 B1
(45) Date of Patent: Dec. 20, 2016

(54) METHOD FOR FABRICATING PHASE CHANGE MEMORY DEVICE

(71) Applicants: Ningbo Advanced Memory Technology Corp., NingBo (CN); Being Advanced Memory Taiwan Limited, Jubei, Hsinchu County (TW)

(72) Inventor: Shui-Chin Su, Jubei (TW)

(73) Assignees: NINGBO ADVANCED MEMORY TECHNOLOGY CORP., Ningbo (CN); BEING ADVANCED MEMORY TAIWAN LIMITED, Jubei, Hsinchu County (TW)

(*) Notice: Subject to any disclaimer, the term of this patent is extended or adjusted under 35 U.S.C. 154(b) by 0 days.

(21) Appl. No.: 15/074,336

(22) Filed: Mar. 18, 2016

(30) Foreign Application Priority Data

Jul. 30, 2015 (CN) .......................... 2015 1 0460085

(51) Int. Cl.
*H01L 45/00* (2006.01)

(52) U.S. Cl.
CPC ............. *H01L 45/126* (2013.01); *H01L 45/06* (2013.01); *H01L 45/1233* (2013.01); *H01L 45/1608* (2013.01); *H01L 45/1666* (2013.01)

(58) Field of Classification Search
None
See application file for complete search history.

(56) References Cited

U.S. PATENT DOCUMENTS

| | | | | |
|---|---|---|---|---|
| 8,110,430 B2* | 2/2012 | Lung | ....................... | H01L 45/06 438/95 |
| 8,497,182 B2* | 7/2013 | Lung | ....................... | H01L 45/06 257/4 |
| 8,513,136 B2* | 8/2013 | Park | ....................... | H01L 45/06 216/11 |
| 8,785,213 B2* | 7/2014 | Oh | ......................... | H01L 45/04 257/E45.004 |
| 2003/0003647 A1* | 1/2003 | Dennison | ............. | H01L 21/761 438/238 |
| 2003/0214856 A1* | 11/2003 | Pellizzer | ................. | G11C 11/56 365/200 |
| 2003/0219924 A1* | 11/2003 | Bez | ..................... | G11C 13/0004 438/102 |
| 2006/0157683 A1* | 7/2006 | Scheuerlein | ........ | H01L 27/2409 257/4 |
| 2006/0284158 A1* | 12/2006 | Lung | ................... | H01L 45/1691 257/2 |
| 2009/0017577 A1* | 1/2009 | An | ...................... | H01L 27/2409 438/102 |
| 2009/0261313 A1* | 10/2009 | Lung | ................... | G11C 11/5678 257/4 |
| 2010/0144138 A1* | 6/2010 | Park | ....................... | H01L 27/24 438/637 |

(Continued)

*Primary Examiner* — Andres Munoz
(74) *Attorney, Agent, or Firm* — Muncy, Geissler, Olds & Lowe, P.C.

(57) ABSTRACT

A method for fabricating a phase change memory device uses the well-developed semiconductor process to fabricate a larger-size sacrifice beforehand, and next uses a wet etching technology to form a narrowed sacrifice layer having a smaller size, and then removes the narrowed sacrifice layer to form the desired mask pattern, whereby the method can precisely define and easily adjust a smaller-size heater and have a stable fabrication process.

10 Claims, 5 Drawing Sheets

(56) References Cited

U.S. PATENT DOCUMENTS

| | | | |
|---|---|---|---|
| 2010/0163820 A1* | 7/2010 | Son | H01L 27/2409 257/2 |
| 2011/0147695 A1* | 6/2011 | Lee | H01L 27/2427 257/4 |
| 2013/0102150 A1* | 4/2013 | Oh | H01L 45/04 438/667 |

* cited by examiner

METHOD FOR FABRICATING PHASE CHANGE MEMORY DEVICE

BACKGROUND OF THE INVENTION

1. Field of the Invention

The present invention relates to a method for fabricating a memory device, particularly to a method for fabricating a phase change memory device, which has a smaller contact area between the heater and the phase change material.

2. Description of the Prior Art

The phase change memory device is a non-volatile random access memory. The phase change memory device contains phase change materials which will switch between a crystalline state and a non-crystalline state by applying appropriate current. Different states of the phase change material, such as a crystalline state, a semi-crystalline state or a non-crystalline state, imply different electric resistances. Normally, the non-crystalline state has a higher electric resistance than the crystalline state. Therefore, data is accessible by measuring the electric resistances.

In order to vary the state of a phase change material, a heater is used to heat the phase change material. In a conventional phase change memory device, a larger junction exists between the heater and the phase change material to achieve better electric conduction. However, phase change needs higher power in a phase change material having a larger junction. Besides, the phase change material is likely to have voids during repeated phase changes, which would degrade the reliability. In another conventional phase change memory device, the phase change material is filled into a gradually-shrinking recess so as to reduce the junction between the heater and the phase change material. As the recess has a smaller bottom, the recess is likely to be incompletely filled and thus have voids, which may degrade the reliability or even directly damage the memory cell.

In a conventional method for fabricating a phase change memory device, a larger through-hole is formed in the mask beforehand. Next, an appropriate material is deposited inside the through-hole. During the deposition process, the through-hole is gradually closed to form a void thereinside. Next, the deposited material is etched to open the through-hole and define a smaller through-hole. Finally, the smaller through-hole is used to define a smaller heater. However, the abovementioned semiconductor process is undeveloped and hard to control the size of the void. Thus, the size of the heater is also hard to control. Therefore, the variance among the larger through-holes, the voids and the smaller through-holes must be stringently controlled lest the memory cells have too great a difference therebetween.

Accordingly, the industry is eager to develop a technology to stably fabricate a phase change memory device having higher reliability and smaller contact area between the heater and the phase change material.

SUMMARY OF THE INVENTION

The present invention provides a method for fabricating a phase change memory device, which uses a well-developed existing semiconductor process to form a smaller-size narrowed sacrifice layer beforehand and then removes the sacrifice layer to form the desire patterned mask, whereby a smaller-size heater is precisely defined.

In one embodiment, the method for fabricating a phase change memory device of the present invention comprises steps: providing a baseplate containing at least one bottom electrode, wherein the baseplate exposes the top surface of the bottom electrode; forming a second dielectric layer on the baseplate, wherein the second dielectric layer covers the bottom electrode; forming a sacrifice layer on the second dielectric layer; forming a first mask on the sacrifice layer; patterning the first mask and the sacrifice layer to form a patterned first mask and a patterned sacrifice layer, wherein the projection of a bottom of the patterned sacrifice layer covers the top surface of the bottom electrode; removing a portion of the patterned sacrifice layer to form a narrowed sacrifice layer, wherein the width of the narrowed sacrifice layer is smaller than the width of the patterned first mask; removing the patterned first mask; forming a second mask on the second dielectric layer, wherein the second mask covers the narrowed sacrifice layer; thinning the second mask to expose the narrowed sacrifice layer; removing the narrowed sacrifice layer to pattern the second mask; forming at least one through-hole penetrating the second dielectric layer to expose the bottom electrode according to said patterned second mask; and filling an electric-conduction material into the through-hole, wherein the electric-conduction material is electrically connected with the bottom electrode.

Below, embodiments are described in detail in cooperation with the attached drawings to make easily understood the objectives, technical contents, characteristics, and accomplishments of the present invention.

DESCRIPTION OF THE PREFERRED EMBODIMENTS

Figure 1:
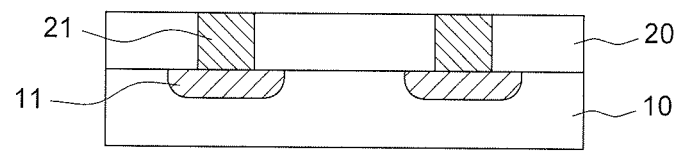
FIGS. 1-15 are diagrams schematically showing a method for fabricating a phase change memory device according to one embodiment of the present invention.

The present invention will be described in detail with embodiments and attached drawings below. However, these embodiments are only to exemplify the present invention but not to limit the scope of the present invention. In addition to the embodiments described in the specification, the present invention also applies to other embodiments. Further, any modification, variation, or substitution, which can be easily made by the persons skilled in that art according to the embodiment of the present invention, is to be also included within the scope of the present invention, which is based on the claims stated below. Although many special details are provided herein to make the readers more fully understand the present invention, the present invention can still be practiced under a condition that these special details are partially or completely omitted. Besides, the elements or steps, which are well known by the persons skilled in the art, are not described herein lest the present invention be limited unnecessarily. Similar or identical elements are denoted with similar or identical symbols in the drawings. It should be noted: the drawings are only to depict the present invention schematically but not to show the real dimensions or quantities of the present invention. Besides, immaterial details are not necessarily depicted in the drawings to achieve conciseness of the drawings.

Refer to FIGS. 1-15 diagrams schematically showing a method for fabricating a phase change memory device according to one embodiment of the present invention. Firstly, provide a substrate 10 including an access circuit 11, wherein the access circuit 11 has at least one electric-conduction contact (not shown in the drawing). In one embodiment, the substrate 10 may be a silicon substrate.

However, the present invention does not limit that the substrate 10 must be a silicon substrate. The substrate 10 may be made of another material, such as a ceramic material, an organic material, or a glass material. In one embodiment, the substrate 10 is a silicon substrate; the access circuit 11 is the source/drain of a transistor in the silicon substrate; the electric-conduction contact is a contact directly contacting the source/drain or a metal silicide on the source/drain. In one embodiment, the substrate 10 is made of silicon, a ceramic material, an organic material, or a glass material; the access circuit 11 may be a metallic layer electrically connected with other memory switches; the electric-conduction contact is a contact between the metallic layer and a bottom electrode 21. It is easily understood that the electric-conduction contact may be a planar electric-conduction area or a pillar-like electric-conduction plug. Next, form a first dielectric layer 20 on the substrate 10, and form at least one through-hole in the first dielectric layer 20 to expose the electric-conduction contact of the access circuit 11. Next, fill an electric-conduction material in the at least one through-hole of the first dielectric layer 20 to form at least one bottom electrode 21, wherein the bottom electrode 21 is electrically connected with the corresponding electric-conduction contact of the access circuit 11, as shown in FIG. 1. The structure shown in FIG. 1 may be regarded as a baseplate having the bottom electrode 21, wherein the top of which is exposed. In one embodiment, a material of the first dielectric layer 20 may be an oxide or a nitride, such as silicon dioxide, silicon nitride, silicon oxynitride, or another dielectric material; a material of the bottom electrode 21 may be tungsten, titanium, tantalum, titanium nitride, tantalum nitride, titanium aluminum nitride, or titanium silicon nitride.

Figure 2:
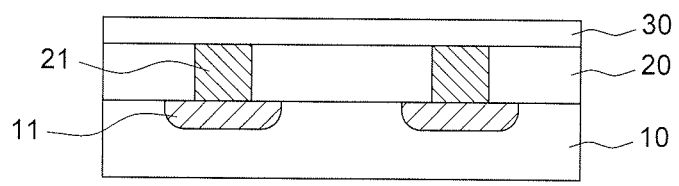
Figure 3:
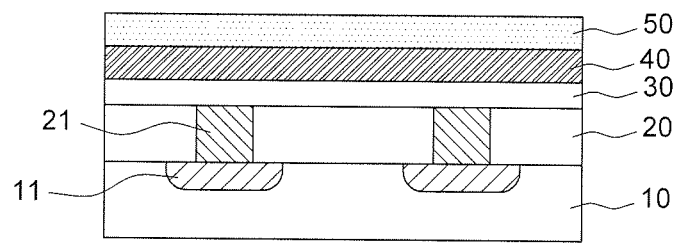

Refer to FIG. 2. Next, form a second dielectric layer 30 on the first dielectric layer 20, wherein the second dielectric layer 30 covers the bottom electrode 21. In one embodiment, a material of the second dielectric layer 30 may be an oxide or a nitride, such as silicon dioxide, silicon nitride, silicon oxynitride, or another dielectric material. Next, form a sacrifice layer 40 on the second dielectric layer 30, and form a first mask 50 on the sacrifice layer 40, as shown in FIG. 3. In one embodiment, a material of the sacrifice layer 40 may be an oxide, and a material of the first mask 50 may be polysilicon or a photoresist material.

Figure 4:
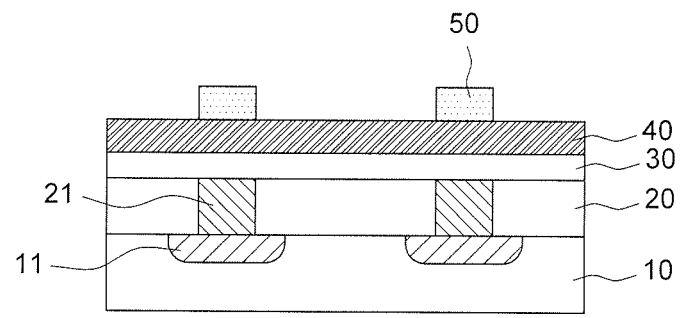
Figure 5:
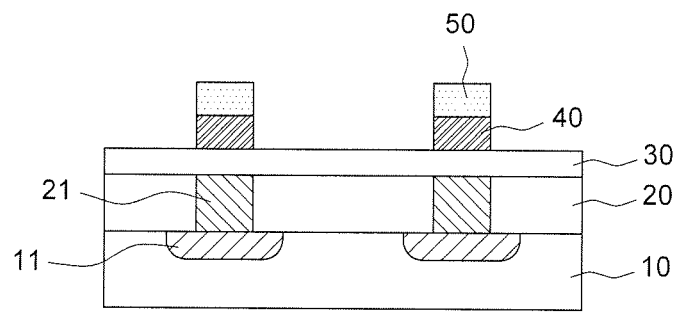
Figure 6:
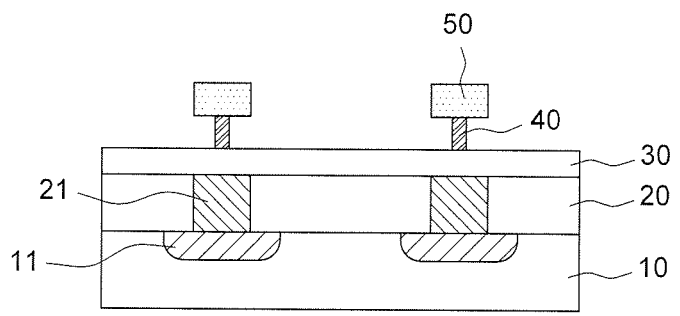

Next, use a semiconductor process, including a photolithographic etching process, to pattern the first mask 50. The positions of the patterned first masks 50 are corresponding to the bottom electrodes 21 in the first dielectric layer 20, as shown in FIG. 4. Next, etch the sacrifice layer 40 according to the patterned first masks 50 so as to pattern the sacrifice layer 40, wherein the projections of the patterned sacrifice layers 40 cover the top surfaces of the bottom electrodes 21, as shown in FIG. 5. In one embodiment, the etching process is realized with a dry etching technology, such as an electrolysis etching technology or a plasma etching technology. Next, remove a portion of the patterned sacrifice layer 40 with a wet etching technology, such as a chemical etching technology, to form a narrowed sacrifice layer 40. As shown in FIG. 6, the width of the narrowed sacrifice layer 40 is smaller than the width of the patterned first mask 50. It is easily understood that the etchant is selected according to the materials of the sacrifice layer 40 and the first mask 50. In other words, an etchant which has a higher etching selectivity ratio for the sacrifice layer 40 to the first mask 50 is selected. In further detail, an etchant, which etches (removes) the sacrifice layer 40 faster than the first mask 50, is selected. It is preferred that the etching liquid etches the sacrifice layer 40 much faster than the first mask 50.

Figure 7:
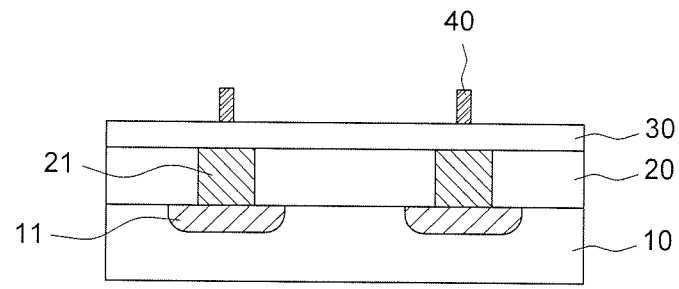
Figure 8:
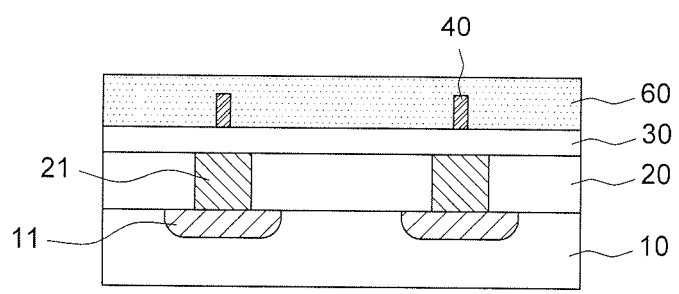
Figure 9:
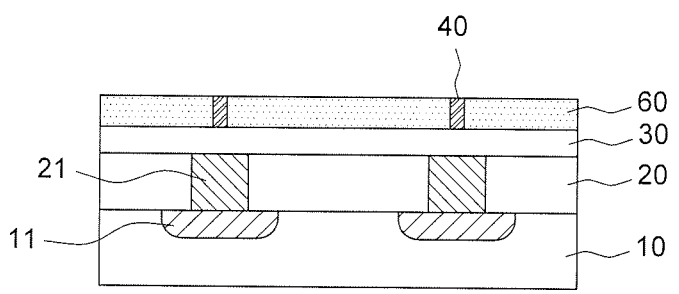
Figure 10:
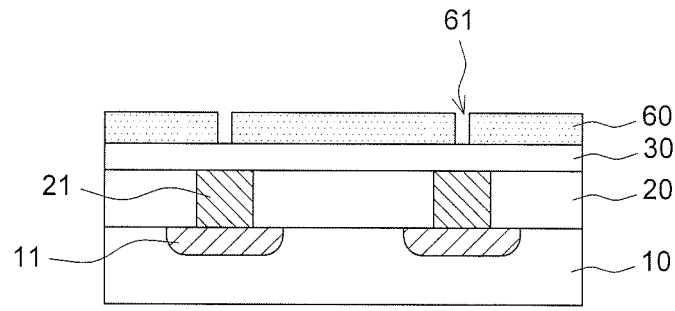

Next, remove the first mask 50 to form a narrowed sacrifice layer 40 with a predetermined size, as shown in FIG. 7. In one embodiment, after the narrowed sacrifice layer 40 is fabricated, check whether the size of the narrowed sacrifice layer 40 meets expectation. If the size of the narrowed sacrifice layer 40 does not meet expectation, remove the narrowed sacrifice layer 40 and execute the steps shown in FIGS. 3-7 once again to rework the narrowed sacrifice layer 40. If the narrowed sacrifice layer 40 meets expectation, form a second mask 60 on the second dielectric layer 30 to cover the narrowed sacrifice layer 40, as shown in FIG. 8. Next, thin the second mask 60 by chemical-mechanical polish (CMP) technology to expose the narrowed sacrifice layer 40, as shown in FIG. 9. Next, remove the narrowed sacrifice layer 40 to form a patterned second mask 60. For example, as shown in FIG. 10, the narrowed sacrifice layer 40 is removed, and that leaves through-holes 61 penetrating the second mask 60 and exposes the second dielectric layer 30. It is easily understood that the positions of the through-holes 61 are corresponding to the bottom electrodes 21 in the first dielectric layer 20. Similarly, the etchant is selected according to the materials of the sacrifice layer 40 and the second mask 60. In other words, an etchant which has a higher etching selectivity ratio for the sacrifice layer 40 to the second mask 60 is selected. In further detail, an etchant, which etches (removes) the sacrifice layer 40 faster than the second mask 60, is selected. It is preferred that the etching liquid etches the sacrifice layer 40 much faster than the second mask 60.

Figure 11:
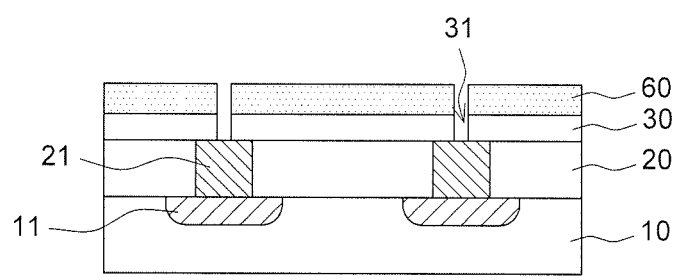
Figure 12:
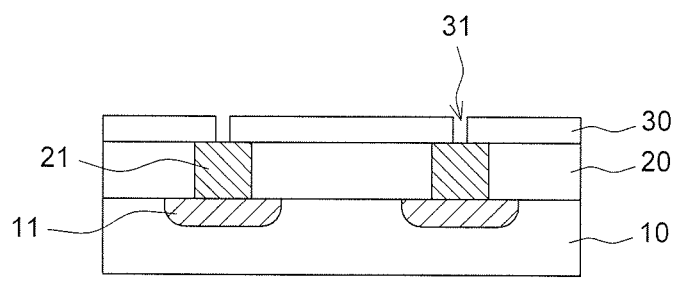
Figure 13:
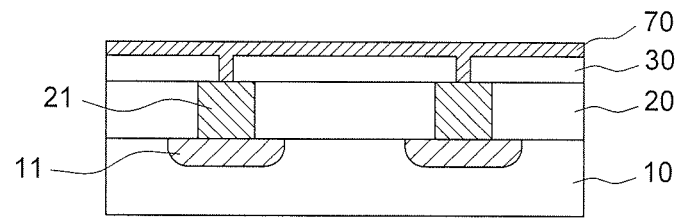
Figure 14:
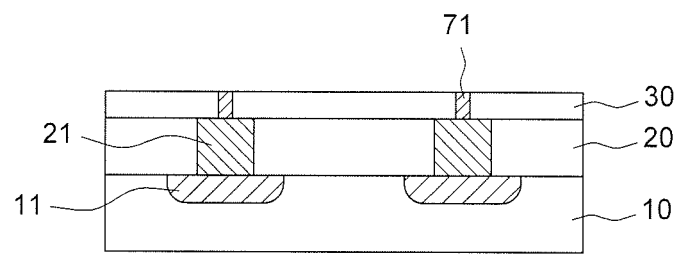

Next, form at least one through-hole 31 in the second dielectric layer 30 according to the patterned second mask 60, wherein the through-hole 31 penetrates the second dielectric layer 30 and exposes the bottom electrodes 21 in the first dielectric layer 20, as shown in FIG. 11. Next, remove the second mask 60, as shown in FIG. 12. Next, fill an electric-conduction material 70 into the through-holes 31 of the second dielectric layer 30, whereby the electric-conduction material 70 is electrically connected with the bottom electrodes 21, as shown in FIG. 13. In one embodiment, the method of forming the electric-conduction material 70 includes a physical vapor deposition (PVD) technology, a chemical vapor deposition (CVD) technology, or an atomic layer deposition (ALD) technology. Next, polish the electric-conduction material 70 with a CMP polisher so that the top surfaces of the electric-conduction material 70 is leveled with the top surface of the second dielectric layer 30, as shown in FIG. 14. Then, the electric-conduction material 70 in the second dielectric layer 30 may function as heaters 71. In one embodiment, the electric-conduction material may be tungsten, titanium, tantalum, titanium nitride, tantalum nitride, titanium aluminum nitride, or titanium silicon nitride.

Figure 15:
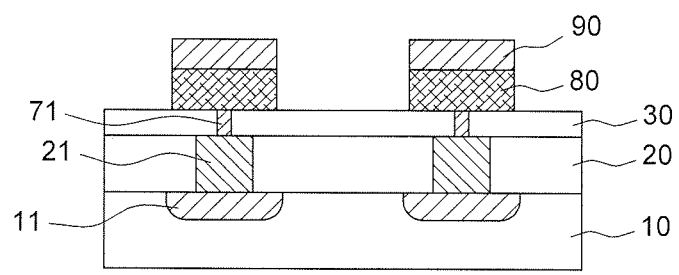

Finally, form a patterned phase change material 80 on the electric-conduction material (i.e. the heaters 71), wherein the patterned phase change material 80 is electrically connected with the heaters 71; and form top electrodes 90 on the phase change material 60, as shown in FIG. 15. In one embodiment, a phase change material is formed over the heaters 71 and patterned by photolithography and etching technologies to form the patterned phase change materials 80 exactly on the corresponding heaters 71. The detailed process of forming the phase change materials 80 and the top electrodes 90 on the heaters 71 can be realized with the existing semiconductor process and will not be repeated herein. In one embodiment, the phase change material 80 may be chalcogenide compounds or alloys of at least one of germanium, antimony, and tellurium. The chalcogenide compounds contain more positively-charged elements or radicals. The chalcogenide alloys are formed by combining a chalcogenide compound and another material, such as a transition metal. Besides, the phase change material may alternatively be the alloys of gallium/antimony, germanium/antimony, indium/antimony, antimony/tellurium, germanium/tellurium, germanium/antimony/tellurium, indium/antimony/tellurium, gallium/selenium/tellurium, tin/antimony/tellurium, indium/antimony/germanium, silver/indium/antimony/tellurium, germanium/tin/antimony/tellurium, germanium/antimony/selenium/tellurium, and tellurium/germanium/antimony/sulfur. It is preferred that the alloy series of the germanium/antimony/tellurium is used as the phase change material.

As described above, the present invention is characterized in transferring the pattern of the first mask 50 to the sacrifice layer 40, narrowing the sacrifice layer 40, and transferring the pattern of the narrowed sacrifice layer 40, which has a smaller size, to the second mask 60. The materials of the sacrifice layer 40, the first mask 50, and the second mask 60 are not limited to be the materials mentioned in the above-mentioned embodiments. In one embodiment, the material of the sacrifice layer 40 may be polysilicon; the material of the first mask 50 may be a photoresist material; the material of the second mask 60 may be an oxide. It should be noted that the method of the present invention can be realized by appropriately selecting the materials of the sacrifice layer 40, the first mask 50, the second mask 60, and the etchant to make the sacrifice layer 40 be etched faster than the first mask 50 and the second mask 60.

As described above, the present invention uses existing well-developed semiconductor processes to transfer the designed pattern among the first mask 50, the sacrifice layer 40 and the second mask 60. The narrowed sacrifice layer 40 without the predetermined size can be removed and reworked, so that the critical dimension of the heater can be adjusted easily and the fabrication process is more stable. In addition, the junction between the heater and the phase change material is decreased so that the state of a small portion of the phase change material can be transformed by smaller current, which means power consumption is reduced and voids produced by repeated phase changes can be avoided. Furthermore, the exposed surface of the heater is flat while depositing the phase change material, so that the voids caused by incompletely filling can be avoided.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the appended claims.

What is claimed is:

1. A method for fabricating a phase change memory device, comprising:
   providing a baseplate containing at least one bottom electrode and exposing a top surface of said at least one bottom electrode;
   forming a second dielectric layer on said baseplate, wherein said second dielectric layer covers said at least one bottom electrode;
   forming a sacrifice layer on said second dielectric layer;
   forming a first mask on said sacrifice layer;
   patterning said first mask and said sacrifice layer to form a patterned first mask and a patterned sacrifice layer, wherein a projection of a bottom of said patterned sacrifice layer covers said top surface of said at least one bottom electrode;
   removing a portion of said patterned sacrifice layer to form a narrowed sacrifice layer, wherein a width of said narrowed sacrifice layer is smaller than a width of said patterned first mask;
   removing said patterned first mask;
   forming a second mask on said second dielectric layer to cover said narrowed sacrifice layer;
   thinning said second mask to expose said narrowed sacrifice layer;
   removing said narrowed sacrifice layer to pattern said second mask;
   forming at least one through-hole penetrating said second dielectric layer and exposing said at least one bottom electrode according to said patterned second mask; and
   filling an electric-conduction material into said at least one through-hole, wherein said electric-conduction material is electrically connected with said at least one bottom electrode.

2. The method for fabricating a phase change memory device according to claim 1 further comprising:
   polishing said electric-conduction material so that a top surface of said electric-conduction material is leveled with a top surface of said second dielectric layer.

3. The method for fabricating a phase change memory device according to claim 2 further comprising:
   forming a patterned phase change material on said electric-conduction material, wherein said patterned phase change material is electrically connected with said electric-conduction material; and
   forming a top electrode on said patterned phase change material.

4. The method for fabricating a phase change memory device according to claim 3, wherein said baseplate includes:
   a substrate having an access circuit, wherein said access circuit includes at least one electric-conduction contact; and
   a first dielectric layer disposed on said substrate, wherein said at least one bottom electrode is disposed in said first dielectric layer and electrically connected with said at least one electric-conduction contact corresponding to said at least one bottom electrode.

5. The method for fabricating a phase change memory device according to claim 4, wherein a material of said first dielectric layer comprises silicon dioxide, silicon nitride, or silicon oxynitride;
   a material of said second dielectric layer comprises silicon dioxide, silicon nitride, or silicon oxynitride;
   said electric-conduction material comprises tungsten, titanium, tantalum, titanium nitride, tantalum nitride, titanium aluminum nitride, titanium silicon nitride; and
   said patterned phase change material comprises a chalcogenide compound or an alloy of at least one of germanium, antimony, and tellurium.

6. The method for fabricating a phase change memory device according to claim 1, wherein removing the portion of said patterned sacrifice layer is realized with a wet etching technology.

7. The method for fabricating a phase change memory device according to claim 1, wherein in removing the portion of said patterned sacrifice layer, said patterned sacrifice layer is removed faster than said patterned first mask.

8. The method for fabricating a phase change memory device according to claim 1, wherein in removing said narrowed sacrifice layer, said narrowed sacrifice layer is removed faster than said second mask.

9. The method for fabricating a phase change memory device according to claim 1, wherein a material of said sacrifice layer comprises an oxide;
- a material of said first mask comprises polysilicon or a photoresist material; and
- a material of said second mask comprises polysilicon.

10. The method for fabricating a phase change memory device according to claim 1, wherein a material of said sacrifice layer comprises polysilicon;
- a material of said first mask comprises a photoresist material; and
- a material of said second mask comprises an oxide.

* * * * *